(12) United States Patent
Tokumaru

(10) Patent No.: US 12,374,605 B2
(45) Date of Patent: Jul. 29, 2025

(54) SEMICONDUCTOR DEVICE

(71) Applicant: Mitsubishi Electric Corporation, Tokyo (JP)

(72) Inventor: Shogo Tokumaru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 222 days.

(21) Appl. No.: 18/040,125

(22) PCT Filed: Oct. 19, 2020

(86) PCT No.: PCT/JP2020/039223
§ 371 (c)(1),
(2) Date: Jan. 31, 2023

(87) PCT Pub. No.: WO2022/085043
PCT Pub. Date: Apr. 28, 2022

(65) Prior Publication Data
US 2023/0275005 A1 Aug. 31, 2023

(51) Int. Cl.
*H01L 23/60* (2006.01)
*H01L 23/00* (2006.01)
(Continued)

(52) U.S. Cl.
CPC ............ *H01L 23/492* (2013.01); *H01L 24/83* (2013.01); *H01L 25/072* (2013.01);
(Continued)

(58) Field of Classification Search
CPC ..... H01L 23/492; H01L 24/83; H01L 25/072; H01L 2224/83801; H01L 2924/13055; H01L 2924/13091; H05K 3/0058
See application file for complete search history.

(56) References Cited

U.S. PATENT DOCUMENTS

2008/0206928 A1 8/2008 Onishi et al.
2018/0301397 A1* 10/2018 Itoh .................. H01L 23/15

FOREIGN PATENT DOCUMENTS

CN 108735679 A 11/2018
JP 2008-207207 A 9/2008
(Continued)

OTHER PUBLICATIONS

An Office Action; "Notice of Reasons for Refusal," mailed by the Japanese Patent Office on Dec. 5, 2023, which corresponds to Japanese Patent Application No. 2022-556831 and is related to U.S. Appl. No. 18/040,125; with English language translation.

(Continued)

*Primary Examiner* — Dale E Page
*Assistant Examiner* — Cristian A Tivarus
(74) *Attorney, Agent, or Firm* — Studebaker Brackett PLLC

(57) ABSTRACT

The present disclosure provides a semiconductor device in which adherence of solder balls to an insulating circuit board and an insulating layer is prevented. The semiconductor device includes a base plate, the insulating circuit board, and particulate matter. The insulating circuit board includes an upper surface holding a semiconductor element, and a lower surface bonded to a front surface of the base plate via a bonding material. The particulate matter adheres to the front surface of the base plate located more outward than the insulating circuit board in a plan view. The bonding material has conductivity. The particulate matter is made of a material identical to that of the bonding material.

3 Claims, 5 Drawing Sheets

(51) Int. Cl.
  *H01L 23/373*    (2006.01)
  *H01L 23/492*    (2006.01)
  *H01L 25/07*     (2006.01)
  *H05K 3/00*      (2006.01)

(52) U.S. Cl.
  CPC .. *H05K 3/0058* (2013.01); *H01L 2224/83801* (2013.01); *H01L 2924/13055* (2013.01); *H01L 2924/13091* (2013.01)

(56) References Cited

FOREIGN PATENT DOCUMENTS

| | | | |
|---|---|---|---|
| JP | 2011100864 A | * | 5/2011 |
| JP | 2015023128 A | * | 2/2015 |
| JP | 2019-110317 A | | 7/2019 |

OTHER PUBLICATIONS

International Search Report issued in PCT/JP2020/039223; mailed Dec. 28, 2020.
An Office Action; mailed by the China National Intellectual Property Administration of the People's Republic of China on Jan. 24, 2025, which corresponds to Chinese Patent Application No. 202080106254.5 and is related to U.S. Appl. No. 18/040,125.

* cited by examiner

F I G. 2
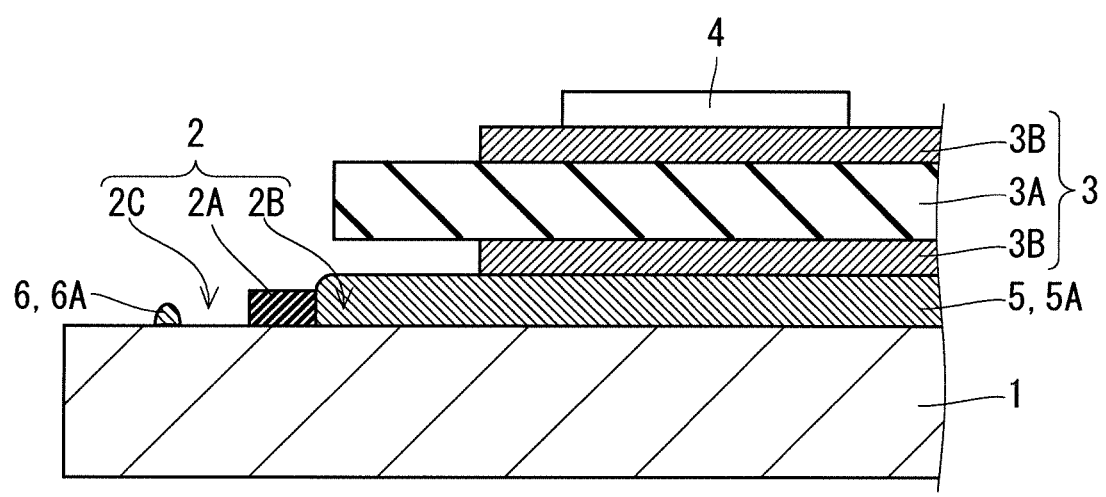

F I G. 3
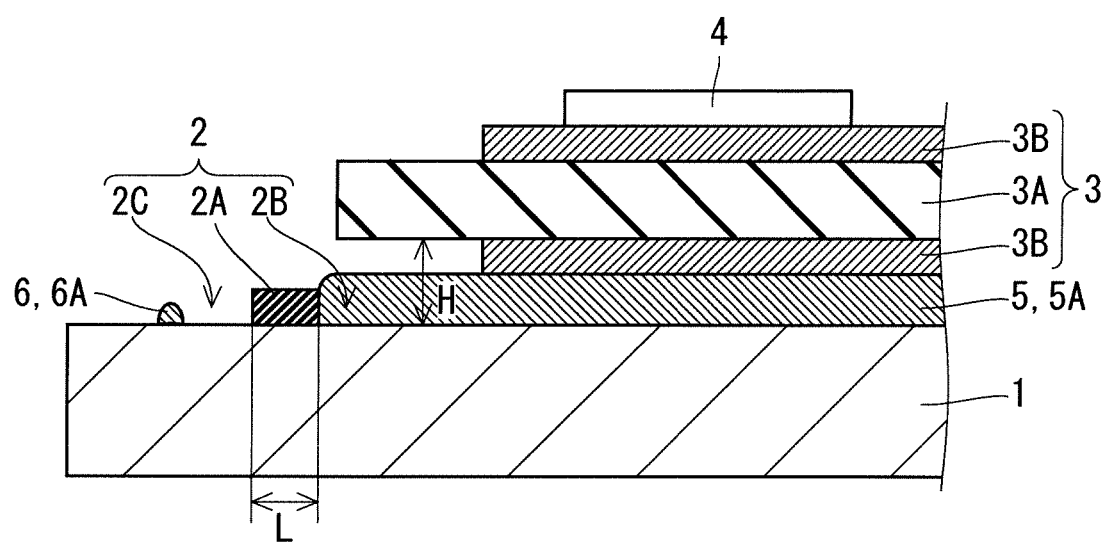

SEMICONDUCTOR DEVICE

TECHNICAL FIELD

The present disclosure relates to a semiconductor device.

BACKGROUND ART

In processes of assembling semiconductor power modules, insulating circuit boards equipped with semiconductor chips (semiconductor elements) are each bonded to a heat sink via solder.

Patent Document 1 discloses a semiconductor device. The semiconductor device includes a first resist layer formed along an outer edge of a bonded region to which a substrate is bonded and which is a region on a heat sink. The first resist layer is severed at some positions along the outer edge.

PRIOR-ART DOCUMENT

Patent Document

Patent Document 1: Japanese Patent Application Laid-Open No. 2011-100864 SUMMARY

Problems to be Solved by the Invention

Solder balls occurring when the insulating circuit boards are bonded to base plates adhere to the insulating circuit boards or insulating layers (resist layers). A potential difference between an insulating circuit board and a base plate may cause discharge between the insulating circuit board and the base plate via the solder balls.

To solve the problem, the present disclosure provides a semiconductor device in which adherence of conductive particulate matter to an insulating circuit board and an insulating layer is prevented.

Means to Solve the Problems

The semiconductor device according to the present disclosure includes a base plate, an insulating circuit board, and particulate matter. The insulating circuit board includes an upper surface holding a semiconductor element, and a lower surface bonded to a front surface of the base plate via a bonding material. The particulate matter adheres to the front surface of the base plate located more outward than the insulating circuit board in a plan view. The bonding material has conductivity. The particulate matter is made of a material identical to that of the bonding material.

Effects of the Invention

In the semiconductor device according to the present disclosure, adherence of conductive particulate matter to an insulating circuit board and an insulating layer is prevented.

The object, features, aspects, and advantages of the present disclosure will become more apparent from the following detailed description and the accompanying drawings.

BRIEF DESCRIPTION OF DRAWINGS

FIG. 2 is a cross-sectional view illustrating the structure of the semiconductor device according to Embodiment 1.

FIG. 3 is a cross-sectional view illustrating a structure of a semiconductor device according to Embodiment 2.

DESCRIPTION OF EMBODIMENTS

Embodiment 1

Figure 1:
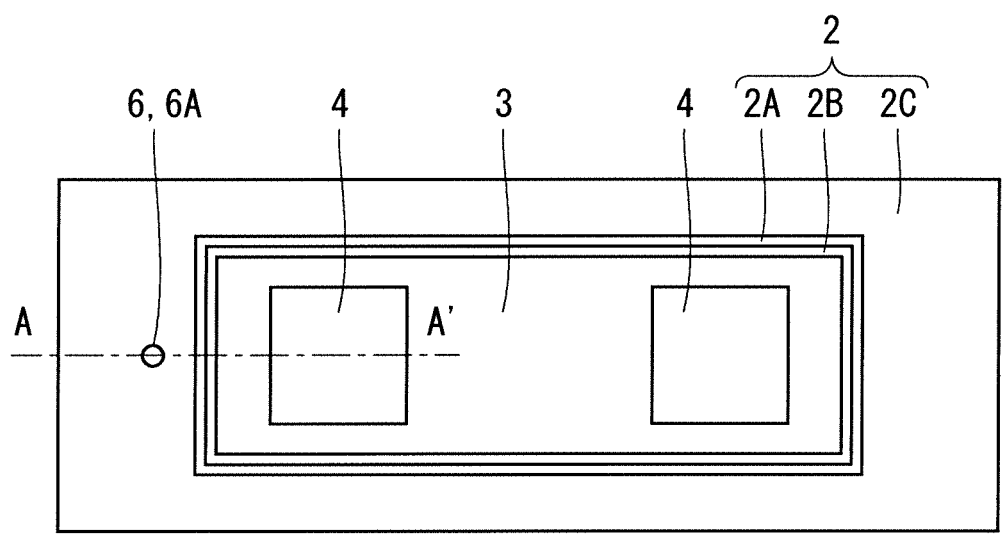
FIG. 1 is a plan view illustrating a structure of a semiconductor device according to Embodiment 1.

FIG. 1 and FIG. 2 are a plan view and a cross-sectional view, respectively, illustrating a structure of a semiconductor device according to Embodiment 1. FIG. 2 is a cross-sectional view taken along A-A' of FIG. 1.

The semiconductor device includes a base plate 1, an insulation pattern 2, an insulating circuit board 3, semiconductor elements 4, and particulate matter 6.

The base plate 1 holds the insulating circuit board 3 and the semiconductor elements 4. The base plate 1 is made of metals including, for example, copper and aluminum. The base plate 1 according to Embodiment 1 is a heat sink with a function of dissipating heat generated in the semiconductor elements 4.

The insulation pattern 2 is to be formed from an insulating layer 2A formed on a front surface of the base plate 1. The insulation pattern 2 includes a bonding opening 2B and a surrounding opening 2C. The insulating layer 2A is, for example, a resist layer. In such a case, the insulation pattern 2 is a resist pattern.

The bonding opening 2B is formed to correspond to a position at which the insulating circuit board 3 is placed. The bonding opening 2B is formed from the insulating layer 2A so that the front surface of the base plate 1 is exposed. The insulating layer 2A is not formed inside the bonding opening 2B. The side surface of the insulation pattern 2 on which the bonding opening 2B is formed is located more outward than the outer edge of the insulating circuit board 3. The shape of the bonding opening 2B is, for example, geometrically similar to the shape of the insulating circuit board 3. The bonding opening 2B in Embodiment 1 has a rectangle larger than the insulating circuit board 3. In a process of manufacturing the semiconductor device, the insulation pattern 2 with the bonding opening 2B facilitates determination of a position of the insulating circuit board 3. Furthermore, the side surface of the insulation pattern 2 on which the bonding opening 2B is formed has a function of damming a bonding material 5 to be described later.

The surrounding opening 2C is formed more outward than the bonding opening 2B. The surrounding opening 2C in Embodiment 1 surrounds the bonding opening 2B. The surrounding opening 2C is formed from the insulating layer 2A so that the front surface of the base plate 1 is exposed. The surrounding opening 2C and the bonding opening 2B form the insulation pattern 2 having a rectangular frame shape.

The insulating circuit board 3 includes an insulating plate 3A, and metal patterns 3B formed on an upper surface and a lower surface of the insulating plate 3A. The metal pattern 3B on the upper surface is bonded to the semiconductor elements 4 via a bonding material (not illustrated). In other words, the insulating circuit board 3 holds the semiconductor elements 4. The metal pattern 3B on the lower surface is bonded via the bonding material 5 to the front surface of the base plate 1 exposed from the bonding opening 2B. In other words, the insulating circuit board 3 is bonded to the front surface of the base plate 1 via the bonding material 5 applied inside the bonding opening 2B. The bonding material 5 has conductivity. The bonding material 5 is, for example, solder 5A.

The semiconductor elements 4 are made of, for example, a semiconductor such as Si or a generally-called wide bandgap semiconductor such as SiC or GaN. The semiconductor elements 4 are, for example, power semiconductor elements, or control integrated circuits (ICs) for controlling the power semiconductor elements. The semiconductor elements 4 are, for example, insulated gate bipolar transistors (IGBTs), metal oxide semiconductor field effect transistors (MOSFETs), or Schottky barrier diodes. Alternatively, the semiconductor elements 4 may be reverse-conducting IGBTs (RC-IGBTs) in each of which an IGBT and a free-wheeling diode are formed on one semiconductor substrate.

The particulate matter 6 is fixed to the front surface of the base plate 1 exposed from the surrounding opening 2C. The particulate matter 6 is made of a material identical to that of the bonding material 5. When the bonding material 5 is the solder 5A, the particulate matter 6 is particulate solder 6A. The adhesion of the particulate matter 6 to the base plate 1 is greater than that to the insulating layer 2A. Alternatively, the wettability of the base plate 1 to the particulate matter 6 is greater than that of the insulating layer 2A to the particulate matter 6.

Although the illustration is omitted, the semiconductor device in Embodiment 1 may further include a casing and a sealant. The casing has a frame shape in a plan view. The casing houses the insulating circuit board 3 and the semiconductor elements 4 inside the frame shape. The sealant has insulating properties. The sealant fills the space inside the casing. Here, the lower surface of the particulate matter 6 is in contact with the front surface of the base plate 1. The surface of the particulate matter 6 other than the lower surface is in contact with the sealant.

An example where the bonding material 5 is the solder 5A will be described below. In a reflow process that is one of processes of manufacturing the semiconductor device, the insulating circuit board 3 is bonded to the front surface of the base plate 1 via the solder 5A. Here, the solder 5A is melted. When the insulating circuit board 3 is mounted on the solder 5A, the solder 5A is sometimes scattered around the bonding opening 2B. As illustrated in FIG. 1, the insulation pattern 2 is not formed immediately below edge portions of the insulating circuit board 3. In other words, the insulation pattern 2 ensures a sufficient distance between the edge portions of the insulating circuit board 3 and the front surface of the base plate 1. Moreover, the solder 5A is more likely to adhere to the front surface of the base plate 1 than to the insulating layer 2A. Thus, the solder 5A scattered from the bonding opening 2B is efficiently discharged outside the insulating circuit board 3.

The discharged solder 5A adheres to the front surface of the base plate 1 in the surrounding opening 2C while being melted, so that the particulate solder 6A is formed. Since the particulate solder 6A is firmly fixed to the front surface of the base plate 1, no solder ball occurs. Thus, the possibility of discharge caused by solder balls is reduced.

In summary, the semiconductor device in Embodiment 1 includes the base plate 1, the insulating circuit board 3, and the particulate matter 6. The insulating circuit board 3 includes an upper surface holding the semiconductor elements 4, and a lower surface bonded to a front surface of the base plate 1 via the bonding material 5. The particulate matter 6 adheres to the front surface of the base plate 1 located more outward than the insulating circuit board 3 in a plan view. The bonding material 5 has conductivity. The particulate matter 6 is made of a material identical to that of the bonding material 5.

In such a semiconductor device, adherence of solder balls to the insulating circuit board 3 and the insulating layer 2A is prevented. For example, even when the solder 5A is scattered from the bonding opening 2B in a process of manufacturing the semiconductor device, the scattered solder 5A is efficiently discharged outside the insulating circuit board 3. In other words, such a structure prevents the solder 5A from adhering to the insulating circuit board 3 by adhering to the insulating layer 2A or moving on the insulating layer 2A. The discharged solder 5A adheres to the front surface of the base plate 1 exposed from the surrounding opening 2C, so that the particulate solder 6A is formed. The particulate solder 6A is more firmly fixed to the base plate 1 than to the insulating layer 2A. The particulate solder 6A once adhering to the base plate 1 hardly flakes off. Thus, the possibility of discharge caused by solder balls is reduced. Specifically, even in the presence of a potential difference between the insulating circuit board 3 and the base plate 1, the possibility of discharge between the insulating circuit board 3 and the base plate 1 is reduced.

Embodiment 2

A semiconductor device according to Embodiment 2 will be described. Embodiment 2 will describe a more specific concept of Embodiment 1. In Embodiment 2, the same reference numerals will be applied to the same constituent elements as those in Embodiment 1, and the detailed description thereof will be omitted.

FIG. 3 is a cross-sectional view illustrating a structure of a semiconductor device according to Embodiment 2. Similarly to Embodiment 1, the insulation pattern 2 is not formed immediately below the edge portions of the lower surface of the insulating circuit board 3. In Embodiment 2, a width L of the insulation pattern 2 between the bonding opening 2B and the surrounding opening 2C is smaller than a distance H from the front surface of the base plate 1 to the lower surface of the insulating circuit board 3. Thus, the solder 5A is more efficiently discharged outside the insulating circuit board 3.

The discharged solder 5A adheres to the front surface of the base plate 1 in the surrounding opening 2C while being melted, so that the particulate solder 6A is formed. Since the particulate solder 6A is firmly fixed to the front surface of the base plate 1, solder balls hardly occur. Thus, the possibility of discharge caused by solder balls is reduced.

Embodiment 3

A semiconductor device according to Embodiment 3 will be described. In Embodiment 3, the same reference numerals will be applied to the same constituent elements as those in Embodiment 1 or 2, and the detailed description thereof will be omitted.

Figure 4:
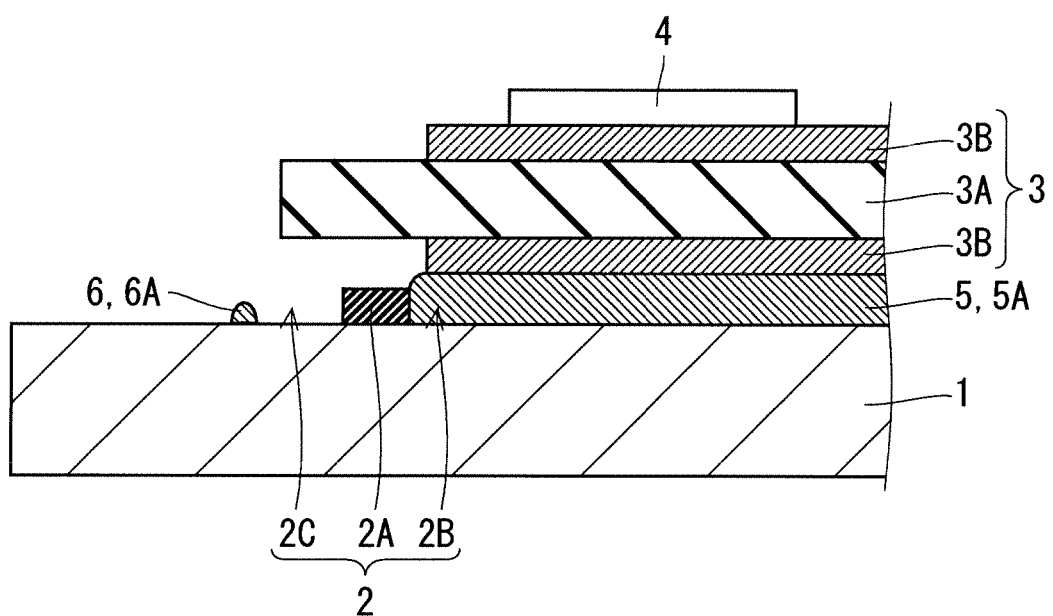
FIG. 4 is a cross-sectional view illustrating a structure of a semiconductor device according to Embodiment 3.

FIG. 4 is a cross-sectional view illustrating a structure of a semiconductor device according to Embodiment 3. The structure other than the insulation pattern 2 is the same as that in Embodiment 1. The frame shape of the insulation pattern 2 is located more inward than the outer edge of the insulating circuit board 3 in a plan view. In other words, the side surface of the insulation pattern 2 on which the surrounding opening 2C is formed is located more inward than the outer edge of the insulating circuit board 3 in a plan view.

Figure 5:
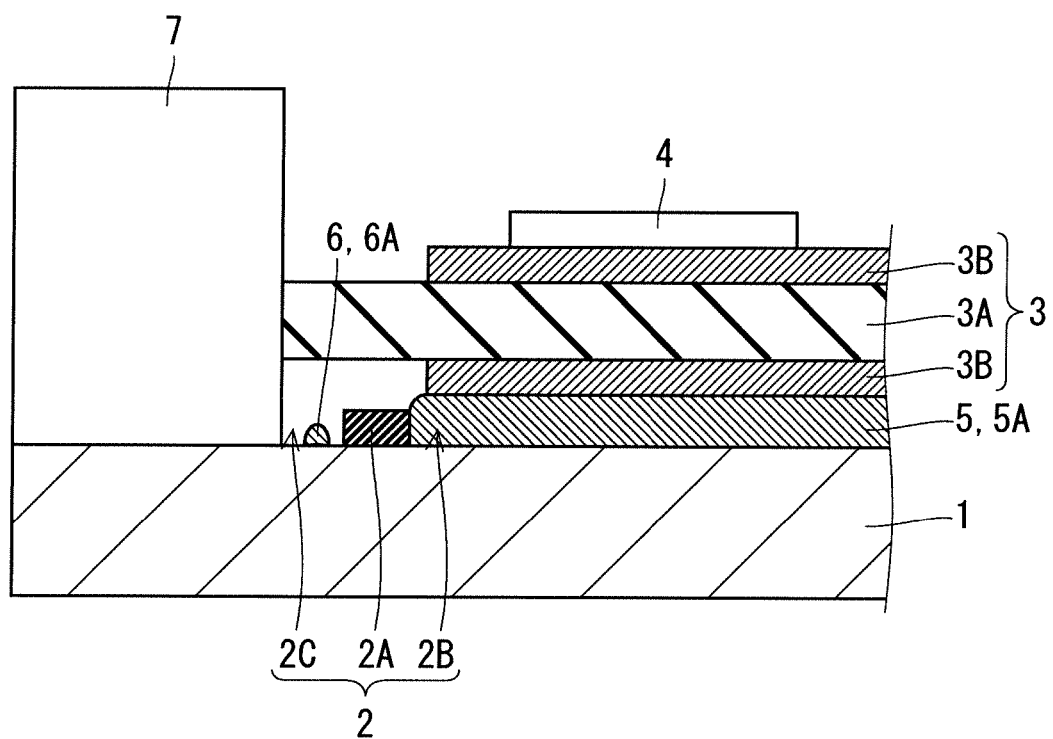
FIG. 5 is a cross-sectional view illustrating a process of manufacturing the semiconductor device according to Embodiment 3.

FIG. 5 is a cross-sectional view illustrating a process of manufacturing the semiconductor device according to Embodiment 3. When the insulating circuit board 3 is bonded to the base plate 1 via the solder 5A, the position of the insulating circuit board 3 is determined by a jig 7. Since the frame shape of the insulation pattern 2 is located more inward than the position at which the insulating circuit board 3 is placed in a plan view, the jig 7 is in direct contact with the front surface of the base plate 1. The jig 7 improves the accuracy of determining the position at which the insulating circuit board 3 is placed. Furthermore, the front surface of the base plate 1 is exposed from the surrounding opening 2C between the jig 7 and the frame shape of the insulation pattern 2. The solder 5A that is scattered in the bonding adheres to the front surface of the base plate 1 between the jig 7 and the side surface of the insulation pattern 2. Then, the particulate solder 6A is formed. Since the particulate solder 6A is firmly fixed to the front surface of the base plate 1, solder balls hardly occur. Consequently, the possibility of discharge caused by solder balls is reduced.

Embodiments of the present disclosure can be freely combined, and appropriately modified or omitted.

EXPLANATION OF REFERENCE SIGNS 1 base plate, 2 insulation pattern, 2A insulating layer, 2B bonding opening, 2C surrounding opening, 3 insulating circuit board, 3A insulating plate, 3B metal pattern, 4 semiconductor element, 5 bonding material, 5A solder, 6 particulate matter, 6A particulate solder, 7 jig.

The invention claimed is:

1. A semiconductor device, comprising:
a base plate;
an insulating circuit board including an upper surface holding a semiconductor element, and a lower surface bonded to a front surface of the base plate via a bonding material;
particulate matter fixed to the front surface of the base plate located more outward than the insulating circuit board in a plan view,
wherein the bonding material has conductivity, and
the particulate matter is made of a material identical to a material of the bonding material; and
an insulation pattern to be formed from an insulating layer formed on the front surface of the base plate,
the insulation pattern including:
a bonding opening formed from the insulating layer so that the front surface of the base plate is exposed; and
a surrounding opening surrounding the bonding opening and formed from the insulating layer so that the front surface of the base plate is exposed,
wherein the insulating circuit board is bonded to the front surface of the base plate via the bonding material applied inside the bonding opening,
the particulate matter adheres to the front surface of the base plate exposed from the surrounding opening, and
an entirety of a side surface of the insulation pattern on which the surrounding opening is formed is located more inward than an outer edge of the insulating circuit board in a plan view.

2. The semiconductor device according to claim 1, wherein
a width of the insulation pattern between the bonding opening and the surrounding opening is smaller than a distance from the front surface of the base plate to the lower surface of the insulating circuit board.

3. The semiconductor device according to claim 1, wherein
an entirety of a side surface of the insulation pattern on which the bonding opening is formed contacts the bonding material.

* * * * *